(12) United States Patent
Cheng (10) Patent No.: US 10,697,712 B2
(45) Date of Patent: Jun. 30, 2020

(54) VAPOR CHAMBER

(71) Applicant: COOLER MASTER CO., LTD., New Taipei (TW)

(72) Inventor: Jen-Chih Cheng, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 56 days.

(21) Appl. No.: 16/243,263

(22) Filed: Jan. 9, 2019

(65) Prior Publication Data

US 2019/0226770 A1    Jul. 25, 2019

Related U.S. Application Data

(60) Provisional application No. 62/620,748, filed on Jan. 23, 2018.

(51) Int. Cl.
*F28D 15/04* (2006.01)
*F28F 3/12* (2006.01)

(52) U.S. Cl.
CPC .............. *F28D 15/046* (2013.01); *F28F 3/12* (2013.01); *F28F 2225/04* (2013.01)

(58) Field of Classification Search
CPC .. F28D 15/0233; F28D 15/0275; F28D 15/04; F28D 15/046; F28F 3/10; F28F 3/12; F28F 2225/04; F28F 2240/00; F28F 2275/06; H01L 23/427
USPC ................ 165/104.26, 104.33, 146
See application file for complete search history.

(56) References Cited

U.S. PATENT DOCUMENTS

| | | | | |
|---|---|---|---|---|
| 6,302,192 | B1 * | 10/2001 | Dussinger | F28D 15/0233 165/104.21 |
| 6,650,544 | B1 * | 11/2003 | Lai | F28D 15/046 165/104.21 |
| 6,896,039 | B2 * | 5/2005 | Dussinger | B22F 3/11 165/104.21 |
| 9,700,930 | B2 * | 7/2017 | Yang | B21D 53/02 |
| 10,228,194 | B2 * | 3/2019 | Zhao | F28D 15/0275 |
| 10,458,718 | B2 * | 10/2019 | Shen | F28D 15/0275 |
| 10,473,404 | B2 * | 11/2019 | Hsieh | F28D 15/046 |
| 2009/0040726 | A1 * | 2/2009 | Hoffman | F28D 15/0233 361/700 |

(Continued)

FOREIGN PATENT DOCUMENTS

TW    575155 U    2/2004
TW    M376120 U1    3/2010

*Primary Examiner* — Keith M Raymond
*Assistant Examiner* — Gustavo A Hincapie Serna
(74) *Attorney, Agent, or Firm* — Birch, Stewart, Kolasch & Birch, LLP (57) ABSTRACT

A vapor chamber has a first plate, a second plate, at least one ring structure, and a chamber. The first plate and the second plate have holes communicating with each other. The second plate has a cavity portion concaved away from the first plate. The ring structure is in the cavity portion and encloses the holes. The chamber is formed between the first plate and the second plate. A capillary structure layer and a working liquid are in the chamber. Therefore, even when either of the first and second plates is broken by heads of screws mounted through the holes, which are larger and oppress the margins of the holes, or even when either of the first and second plates is broken during forming of the holes via stamping or drilling, the chamber always remain sealed.

13 Claims, 10 Drawing Sheets

(56) References Cited

U.S. PATENT DOCUMENTS

| | | | |
|---|---|---|---|
| 2011/0192004 A1* | 8/2011 | Wang | B01B 1/00 29/428 |
| 2013/0043000 A1* | 2/2013 | Wang | F28D 15/0233 165/67 |
| 2014/0090803 A1* | 4/2014 | Schmid | F28F 3/12 165/76 |
| 2017/0122672 A1* | 5/2017 | Lin | B23K 1/0012 |
| 2019/0027425 A1* | 1/2019 | Mira | F28D 15/0233 |

* cited by examiner

VAPOR CHAMBER

CROSS-REFERENCE TO RELATED APPLICATIONS

This application is based upon and claims priority under 35 U.S.C. 119 from U.S. Provisional Application No. 62/620,748 filed on Jan. 23, 2018, which is hereby specifically incorporated herein by this reference thereto.

BACKGROUND OF THE INVENTION

1. Field of the Invention

The present invention relates to a heat dissipation component in a heat sink, particularly a vapor chamber.

2. Description of the Prior Arts

Vapor chambers are widely used because they usually do not occupy much space, and yet can efficiently and evenly dissipate heat from a heat source of a very small area to a much larger area or surface. A conventional vapor chamber comprises two narrowly spaced apart plates joined together at their edges (typically by welding), with a thin internal chamber space formed between the two plates surrounded and sealed by the edges. Before the internal chamber space is completely sealed, thereby forming a chamber, a working liquid is injected into the internal chamber space, which is then vacuumed to create a low pressure inside the chamber. Certain interior areas of the two plates may also be joined together (e.g., by welding), and holes can be formed within such areas of the joined portions without breaking the seal. In particular, the holes on one plate within the areas of the joined portions are aligned with the holes on the other plate, such that the portions of the two plates' interior areas surrounding the holes are completely joined together for the chamber to remain sealed. The vapor chamber as a whole therefore can be secured onto an object via screws mounted through the holes.

But to reduce thermal resistance, the vapor chamber space between the two plates is typically made as thin as possible, and the two plates themselves are also made as thin as possible. Because the plates are thin (and thus tend to be weak in their mechanical strengths), and because the pressure difference between inside and outside of the chamber is too much, the vapor chamber tends to be fragile and cannot withstand too much external force. For example, because some holes of the vapor chamber are made through stamping or drilling after two plates are sealed, force or stress generated by the stamping or drilling might make the sealed or welded part around the hole break; or if a screw mounted through one of the interior holes as described above has a head larger than the joined portion around the hole, the screw's head may abut and thus crush a portion of the plate that forms the vapor chamber. This may result in a crack on the plate, which can break the vacuum and cause the vapor chamber to fail.

The present invention provides a vapor chamber to mitigate or obviate the aforementioned problems.

SUMMARY OF THE INVENTION

The main objective of the present invention is to provide a vapor chamber that may not be broken when fixed by screws.

The vapor chamber has a first plate, a second plate, at least one ring structure, a chamber, at least one first capillary structure layer, and a working liquid. The first plate forms at least one hole. The second plate forms a cavity portion, a margin portion, at least one annular protrusion, and at least one hole. The cavity portion is concaved away from the first plate. The margin portion surrounds the cavity portion and is joined to and sealed on the first plate. The at least one annular protrusion is in the cavity portion and protrudes toward the first plate, and a top portion of the at least one annular protrusion is joined to the first plate. The at least one hole is in the cavity portion, formed through the at least one annular protrusion, and aligned to and communicates with the at least one hole of the first plate. An edge of the at least one hole of the first plate contacts an edge of the at least one hole of the second plate. The at least one ring structure is sealed on and joined to the first plate and the second plate in the cavity portion, and encircles and surrounds the at least one annular protrusion of the second plate and the at least one hole on the at least one annular protrusion. The chamber is formed by the first plate, the cavity portion of the second plate, an inner surface of the margin portion, and an outer surface of the at least one ring structure. The at least one first capillary structure layer is in the chamber, and the at least one first capillary structure layer is on a surface, which faces to the second plate, of the first plate, or the at least one first capillary structure layer is on a surface, which faces to the first plate, of the second plate. The working liquid in the chamber.

Consequently, the vapor chamber in accordance with the present invention is sealed by the ring structures. With such structures, the chamber can keep sealed even when heads of screws mounted through the holes for fixing the vapor chamber are larger and oppress the margins of the holes or even when the vapor chamber undergoes a stamping or drilling process.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
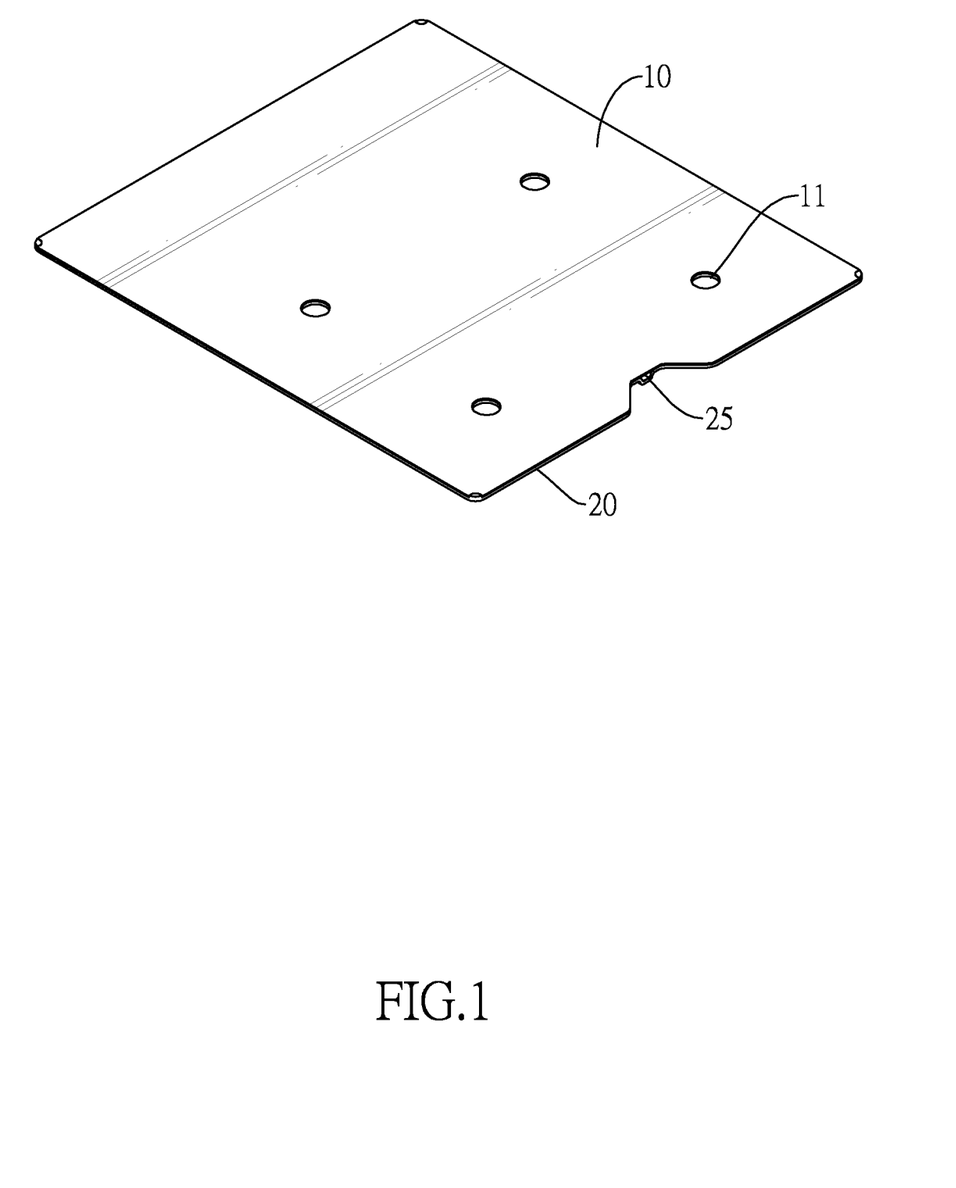
FIG. 1 is a perspective view of a vapor chamber in accordance with a first embodiment of the present invention.
Figure 2:
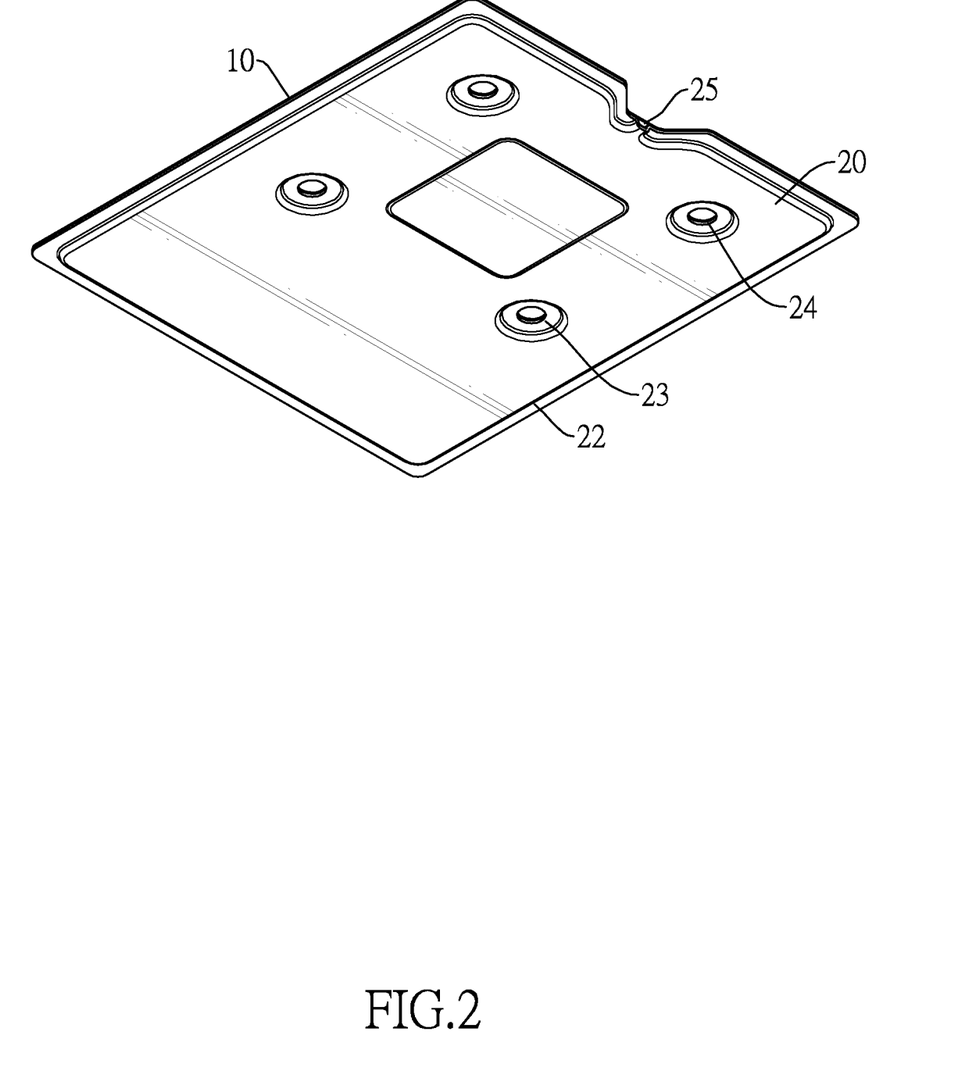
FIG. 2 is another perspective view of the vapor chamber in FIG. 1.
Figure 3:
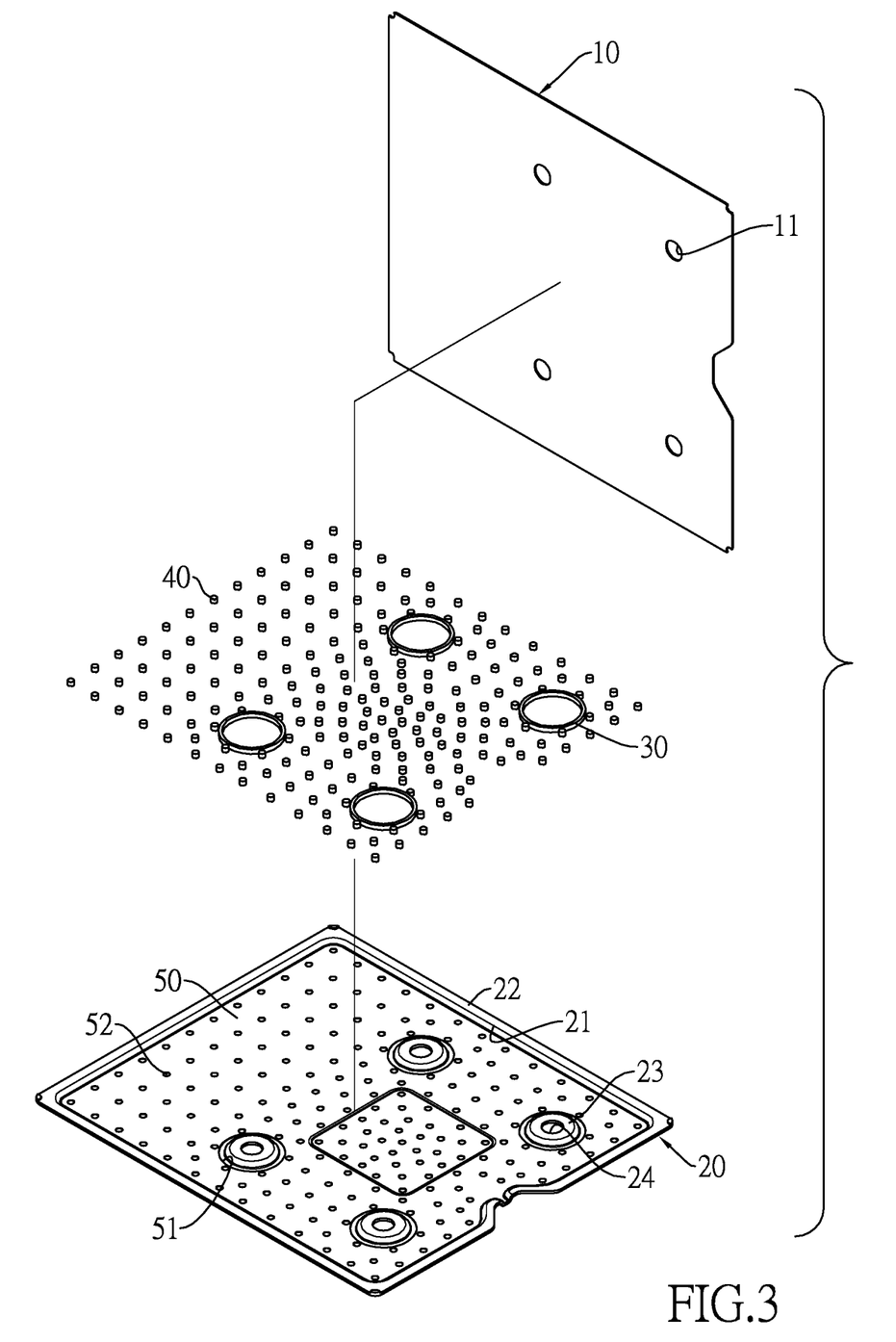
FIG. 3 is an exploded view of the vapor chamber in FIG. 1.

With reference to FIGS. 1 to 3, a vapor chamber in accordance with a first embodiment of the present invention may comprise a first plate 10, a second plate 20, at least one ring structure 30, a plurality of spacers 40, and at least one first capillary structure layer 50.

In this embodiment, a contour of the first plate 10 and a contour of the second plate 20 may match each other or may be the same, and may be joined and sealed together, for example, by welding. The first plate 10 may be flat and may comprise one or more holes 11. The second plate 20 may comprise a cavity portion 21, a margin portion 22, one or more annular protrusions 23 located interiorly within the cavity portion 21 and protruding toward the first plate 10, and one or more holes 24. Each annular protrusion 23 may surround and encircle a respective one of the holes 24. In other words, each one of the holes 24 is formed through a respective one of the annular protrusions 23. An opening of the cavity portion 21 of the second plate 20 may face toward the first plate 10 so that the cavity portion 21 is concaved away from the first plate 10. The margin portion 22 surrounds the cavity portion 21, and, in this embodiment, the margin portion 22 extends along the contour of the second plate 20, but it is not limited thereto. The cavity portion 21 of the second plate 20 and the first plate 10 may together form a chamber space when the contour of the first plate 10 and the contour of the second plate 20 are joined together at and along the margin portion 22. The margin portion 22 may extend along the contour of the second plate 20 and around the cavity portion 21. Furthermore, the margin portion 22 may be attached and welded onto the first plate 10 such that the chamber space is sealed.

The number of the holes 24 located at the annular protrusions 23 of the second plate 20 may be equal to the number of the holes 11 of the first plate 10. Each hole 24 of the second plate 20 may be matched and aligned with a respective one of the holes 11 of the first plate 10. A top portion of each annular protrusion 23 contacts and may be joined with the first plate 10 (for example, by welding) such that the chamber space formed by the cavity portion 21 of the second plate 20 and the first plate 10 after the joinder of the two plates at and along the margin portion 22 may remain sealed at the holes 11 and holes 24 by the annular protrusions 23.

In a preferred embodiment, the vapor chamber may further comprise one or more ring structures 30 located inside the cavity portion 21. Each ring structure 30 may encircle and surround a respective one of the holes 24. In this embodiment, each ring structure 30 may encircle and surround the annular protrusions 23 and may extend fully between the first plate 10 and the second plate 20. In another preferred embodiment, each ring structure 30 may be mounted to, and may be further joined and sealed with, the first and the second plates 10, 20.

Figure 4:
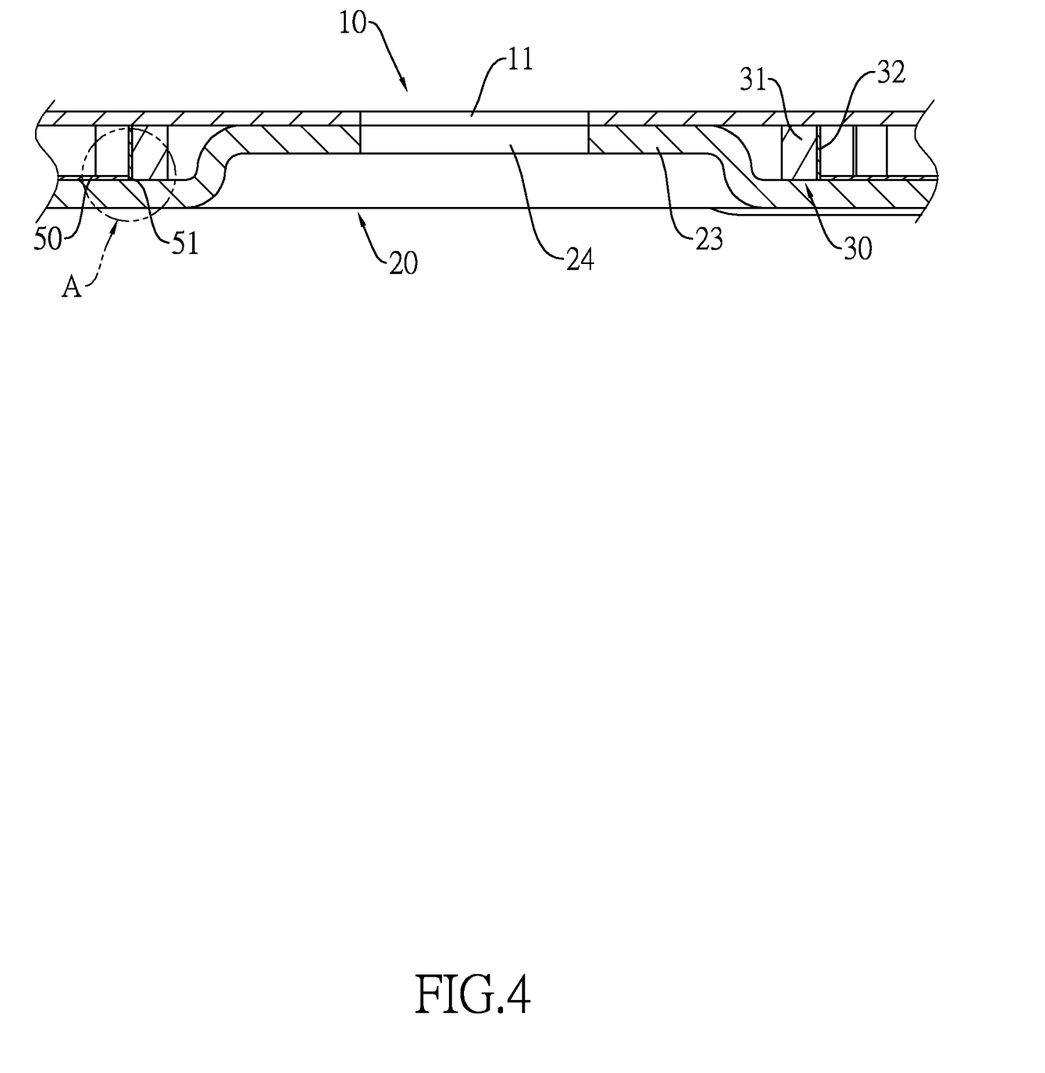
FIG. 4 is a sectional view of a ring structure of the vapor chamber in FIG. 1.

Please refer to FIGS. 3 and 4. Each ring structure 30 in this preferred embodiment may comprise a ring body 31, which may comprise a top connecting surface located on the top of the ring body 31, a bottom connecting surface located at the bottom of the ring body 31, an inner surface located at the interior of the ring body 31, and an outer surface located at the exterior of the ring body 31, as shown in FIG. 4. The inner surface and the outer surface of the ring body 31 may be located between the top and bottom connecting surfaces of the ring body 31. Conversely, the top surface and the bottom surface of the ring body 31 may be located between the inner and outer surfaces of the ring body 31. In particular, the inner surface of each ring body 31 may surround and encircle a respective one of the annular protrusions 23. A space surrounded by the inner surface of the ring body 31 is isolated from the chamber space and configured for a screw to be mounted through.

In another preferred embodiment, the top connecting surface and the bottom connecting surface of the ring body 31 may extend fully between, may be in contact with, or may be mounted to the first plate 10 and the second plate 20, respectively. In yet another preferred embodiment, the top connecting surface and the bottom connecting surface of the ring body 31 may further be joined and sealed with the first plate 10 and the second plate 20, respectively, by welding or other methods. Therefore, the chamber is formed and sealed by the first plate 10, the cavity portion 21 of the second plate 20, the margin portion 22 of the second plate 20, and the outer surface of the ring body 31, such that no vapor may breach or otherwise be present inside the space formed, surrounded, and sealed by the inner surface of the ring body 31, the protrusion 23, the first plate 10, and the second plate 20. In another embodiment, the bottom connecting surface of each ring body 31 may be joined and sealed on a respective one of the annular protrusions 23, but the top connecting surface of each ring body 31 is still joined and sealed on the first plate 10, and thus the chamber space is formed.

Each ring structure 30 may further comprise a second capillary structure layer 32 covering the outer surface of the ring body 31 (especially an upper edge and a lower edge of the outer surface) in this preferred embodiment.

Figure 7:
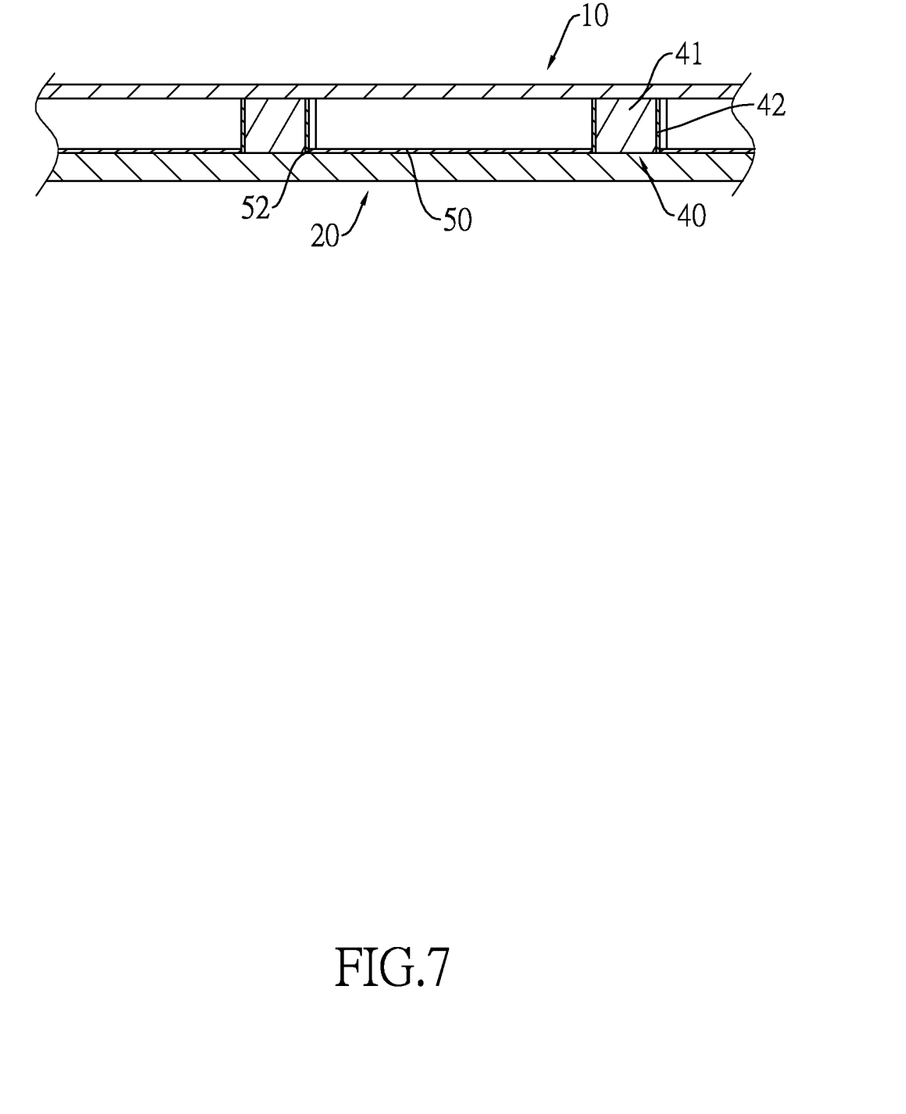
FIG. 7 is a sectional view of a spacer of the vapor chamber in FIG. 1.

Please refer to FIGS. 3 and 7. Spacers 40 may be located between the first plate 10 and the second plate 20 and may be scattered around inside the cavity portion 21 of the second plate 20. In other words, the spacers 40 may be located and scattered around inside the chamber space formed by the cavity portion 21 of the second plate 20 and the first plate 10 after the joinder of the two plates at and along the margin portion 22. Each one of the spacers 40 comprises a spacer body 41, which may comprise two connecting surfaces and at least one lateral surface, and the at least one lateral surface is located between the two connecting surfaces. The two connecting surfaces of each spacer body 41 may comprise a bottom surface and a top surface of the spacer body 41, and the two connecting surfaces of the spacer body 41 may contact the first plate 10 and the second plate 20, respectively. In another preferred embodiment, each one of the spacers 40 may be welded or otherwise mounted onto the first plate 10 and the second plate 20, such that the spacers 40 may not be moved or otherwise dislocated. In yet another embodiment, the two connecting surfaces of each spacer body 41 may be adhered to or tightly abutted by the first plate 10 and the second plate 20, respectively.

In another preferred embodiment, when a sectional shape of the spacer body 41 is round, the spacer body 41 may have one lateral surface; when a sectional shape of the spacer body 41 is polygonal, the spacer body 41 may have multiple lateral surfaces. Each one of the spacers 40 may also comprise a third capillary structure layer 42, in which case the third capillary structure layer 42 of the spacer 40 may cover the lateral surface(s) of the spacer body 41, and may cover upper edges and lower edge of the lateral surfaces of the spacer body 41.

Please refer to FIGS. 3, 4, and 7. The first capillary structure layer 50 may be located on a surface of the first plate 10 facing toward the second plate 20, or on a bottom surface of the cavity portion 21 of the second plate 20 and may be on a side wall of the cavity portion 21. In this embodiment, the vapor chamber may only have one first capillary structure layer 50 and the first capillary structure layer 50 is mounted on the bottom surface of the cavity portion 21. Therefore, the first capillary structure layer 50 is located inside the chamber that is between the first plate 10 and the second plate 20.

The first capillary structure layer 50 may comprise one or more first apertures 51 and a plurality of second apertures 52.

The number of the first apertures 51 may be equal to the number of the ring structures 30, such that each one of the first apertures 51 surrounds and encircles a respective one of the annular protrusion 23. The first capillary structure layer 50 may be on a lateral surface of the corresponding annular protrusion 23 and may not cover a top surface of said annular protrusion 23 such that a first aperture 51 may encircle the top surface of said annular protrusion 23; or, the first capillary structure layer 50 may be around the entire annular protrusion 23 such that a first aperture 51 may be formed on and encircle said entire annular protrusion 23. In other words, the first capillary structure layer 50 does not cover the lateral surface of the corresponding annular protrusion 23. However, in this preferred embodiment, a gap may be formed between the first capillary structure layer 50 and the annular protrusion 23, and the ring structure 30 may be disposed at the gap such that the first aperture 51 may be formed on and encircle said ring structure 30.

Figure 5:
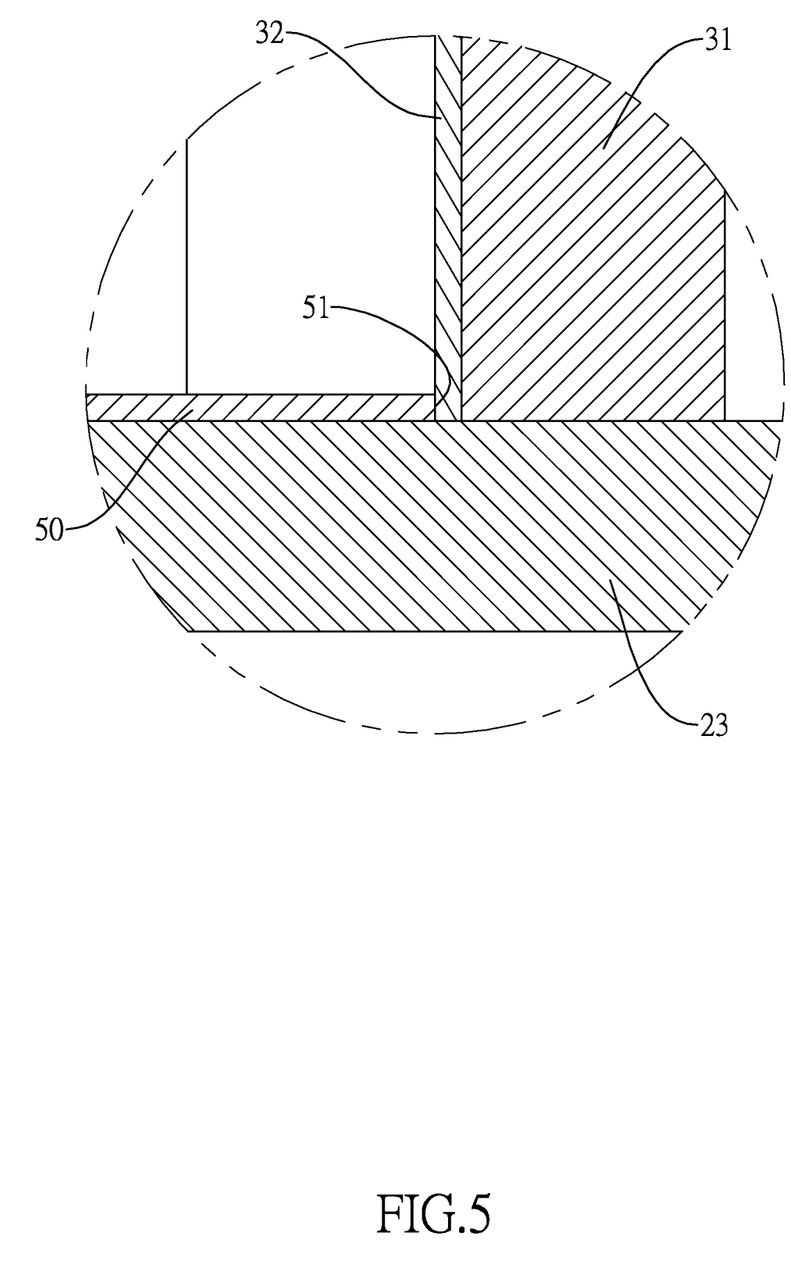
FIG. 5 is an enlarged view of connecting parts of capillary structure layers in FIG. 4.

Then please also refer to FIG. 5. Dimensions of a first aperture 51 may be equal to or slightly larger than those of the ring body 31 surrounded and encircled by said first aperture 51, such that said first aperture 51 of the first capillary structure layer 50 on the first plate 10 and the second plate 20 contacts the upper edge or the lower edge of the second capillary structure layer 32 of the corresponding ring body 31. In this embodiment, an inner surface of the first aperture 51 of the first capillary structure layer 50 annularly contacts the upper edge or the lower edge of the second capillary structure layer 32 of the corresponding ring structure 30, respectively. In other words, two end surfaces of the second capillary structure layer 32 of each ring structure 30 contact the first plate 10 and the second plate 20, respectively. Therefore, a working liquid flowing between the first plate 10 and the second plate 20 via the second capillary structure layer 32 may encounter less resistance and thus flow more smoothly.

Please refer to FIG. 7. A number of the second apertures 52 may be equal to the number of the spacers 40, such that each one of the second apertures 52 surrounds and encircles a respective one of the spacers 40. Dimensions of each one of the second apertures 52 may be equal to or slightly larger than those of the spacer body 41 surrounded and encircled by said second aperture 52, such that the second apertures 52 of the first capillary structure layer 50 on the first plate 10 and the second plate 20 contact the lower edge of the third capillary structure layer 42 of the corresponding spacer 40. In this embodiment, inner surfaces of the second aperture 52 of the first capillary structure layer 50 may annularly contact the lower edge of the third capillary structure layer 42 of the corresponding spacer 40, respectively. In other words, the two end surfaces of the third capillary structure layer 42 of each spacer 40 may contact the first plate 10 and the second plate 20, respectively.

Figure 6:
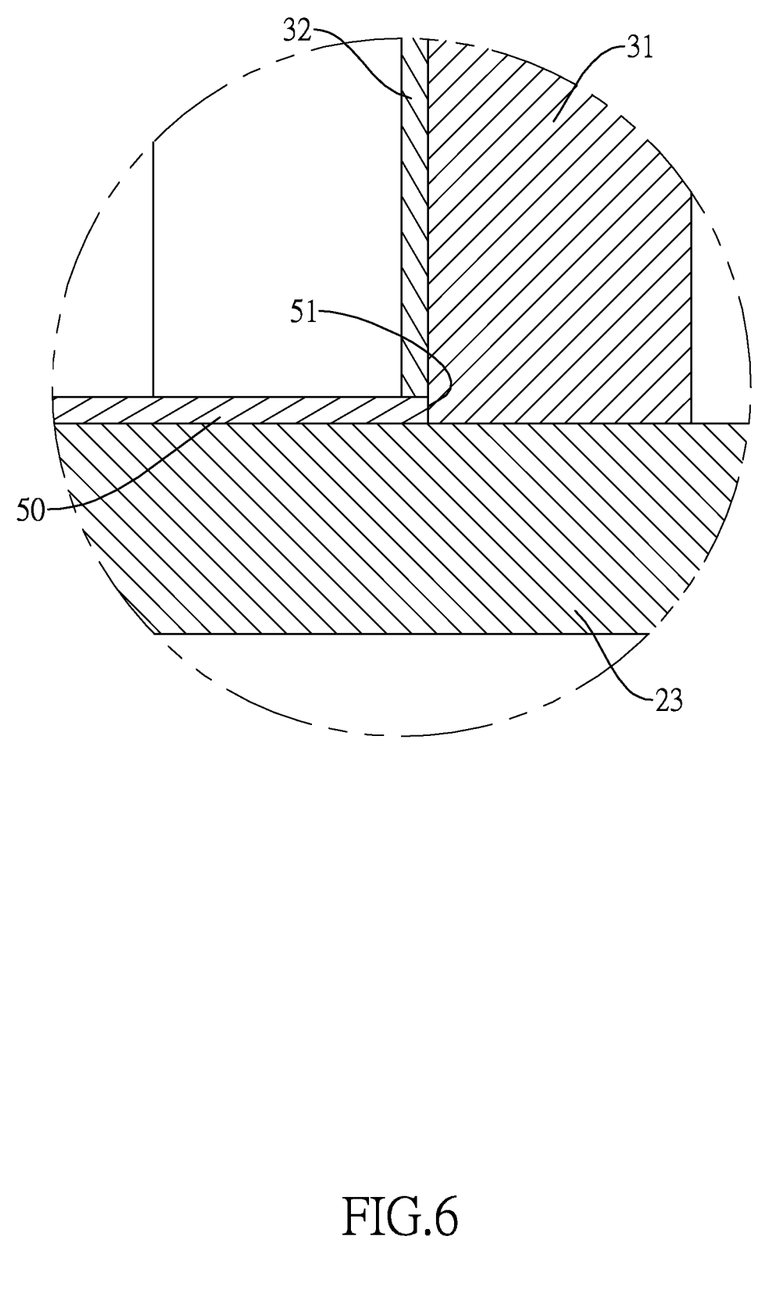
FIG. 6 is an enlarged view of connecting parts of capillary structure layers in another configuration.

Please refer to FIGS. 4, 6, and 7. In another embodiment, the second capillary structure layer 32 of each one of the ring structures 30 may not cover the upper edge and the lower edge of the outer surface of the ring body 31, and the widths of said upper edge and the lower edge that are not covered by the second capillary structure layer 32 may be equal to the thicknesses of the first capillary structure layer 50 on the first plate 10 and the second plate 20. Therefore, the inner surface of each first aperture 51 of each first capillary structure layer 50 may contact the outer surface of each ring body 31. Similarly, the third capillary structure layer 42 of each spacer 40 may not cover the upper edge and lower edge of the lateral surface(s) of each spacer body 41, and thereby the inner surface of each second aperture 52 of each first capillary structure layer 50 may contact the lateral surface(s) of each spacer body 41. Furthermore, the edge of each first aperture 51 of each first capillary structure layer 50 may contact the end surface of the second capillary structure layer 32 of each ring structure 30, and the edge of each second aperture 52 of each first capillary structure layer 50 may contact the end surface of the third capillary structure layer 42 of each spacer 40.

In another embodiment, a dimension of each first aperture 51 may be equal to that of each ring structure 30, and a dimension of each second aperture 52 may be equal to that of each spacer 40; the second capillary structure layer 32 or third capillary structure layer 42 may cover the entire upper edge and lower edge of the outer surface of each ring body 31 or the lateral surface of each spacer body 41, such that the first apertures 51 and the second apertures 52 of the first capillary structure layer 50 may contact the second capillary structure layers 32 and the third capillary structure layers 42, respectively.

Materials of the first capillary structure layer 50, the second capillary structure layers 32, and the third capillary structure layers 42 may be the same or different, and each one of them may be selected from a group comprising a mesh structure, a fiber texture, a sintered powder structure, and/or a groove structure, etc.

Please refer to FIGS. 1 to 4, and 7. In the manufacturing process for the vapor chamber in a preferred embodiment, two plates (e.g., the aforementioned first plate 10 and second plate 20) may be provided first. One of the two plates (e.g., the second plate 20) may have a cavity portion 21 and a plurality of round protrusions located in the cavity portion 21, but the two plates may or may not comprise any holes. The first capillary structure layer 50 may be formed on or attached to the second plate 20, respectively. The first capillary structure layer 50 may comprise a plurality of first apertures 51 and a plurality of second apertures 52. A plurality of ring structures 30 and a plurality of spacers 40 may be provided and may be respectively disposed in the first apertures 51 and the second apertures 52 of the first capillary structure layer 50 in the cavity portion 21 of the second plate 20.

In another embodiment, the two plates may be aligned with each other and combined together by welding. The margin of the second plate 20 surrounding the cavity portion 21 may be welded onto the other plate (e.g., the first plate 10) as a whole, but an injecting hole 25 may be formed at edges of the two plates. A top portion of each round protrusion may be welded on the first plate 10 as a whole, and the ring structures 30 and the spacers 40 may be welded on the first plate 10 and the second plate 20 as a whole, too. A working liquid may be injected into the chamber space between the first plate 10 and the second plate 20 through the injecting hole 25, and the chamber space may be vacuumed. After the chamber space is vacuumed, the injecting hole 25 at the edges of the first plate 10 and the second plate 20 may be sealed immediately. A center of each round protrusion may be drilled, and thus a hole 11 or a hole 24 may be formed at the first plate 10 and the second plate 20. After stamping or drilling, the round protrusions may become the aforesaid annular protrusions 23.

With the ring structures 30 contacting the first plate 10 and the second plate 20 and encircling the annular protrusions 23 and the holes 24 of the second plate 20, the vapor chamber of a preferred embodiment may be sealed further. For example, the annular protrusions 23 of the second plate 20 may contact and may be welded onto the first plate 10, such that the chamber space between the two plates may remain sealed. Furthermore, with the ring bodies 31 of the ring structures 30 contacting and welded onto the first plate 10 and the second plate 20, and with the ring structures 30 encircling the annular protrusions 23, the vapor chamber may stop at the outer surfaces of the ring structures, which provide additional circular sealing on top of the circular seals provided at the annular protrusions 23 where the first plate 10 and the second plate 20 join together. In this embodiment, for example, if a portion around an annular protrusion 23 is crushed and/or cracked, the ring structure 30 encircling said annular protrusion 23 can keep the chamber space sealed, and a vacuum in the chamber space may not be breached.

In another preferred embodiment, dimensions of a first aperture 51 of the first capillary structure layer 50 may be larger than those of the ring structure 30 encircled and surrounded by said aperture 51. That is, the first capillary structure layer 50 may not cover the two connecting surfaces of the ring body 31 and the portions on the first plate 10 and the second plate 20 corresponding to the ring body 31's connecting surfaces. In this embodiment, the ring body 31 is easier to be welded onto the first plate 10 and the second plate 20 at the ring body's 31 two connecting surfaces. In this example, the ring body 31, the first plate 10, and the second plate 20 may be combined as a whole. In yet another preferred embodiment, a surface of an annular protrusion 23 (especially a surface of the top portion of an annular protrusion 23) may not be covered by the first capillary structure layer 50. In this embodiment, it may be easier to weld the annular protrusion 23 of the second plate 20 onto the first plate 10, and thus the annular protrusion 23 and the first plate 10 may be combined as a whole.

In another preferred embodiment, the first plate 10 and the second plate 20 of the vapor chamber may be combined thoroughly because the plates' margin portion 22 and the annular protrusions 23 are not covered by the first capillary structure layer 50. The ring structures 30 encircling the annular protrusions 23 may keep the vapor chamber sealed even though the annular protrusions 23 may be crushed during stamping, drilling, or by screws.

In another preferred embodiment, the annular protrusions 23 may not be formed on the second plate 20, but on the first plate 10 instead. Thus, the annular protrusions on the first plate 10 protrude toward the second plate 20, which allows a margin of each hole 11 of the first plate 10 to be joined and sealed on a margin of a respective one of the holes 24 of the second plate 20, but it is not limited thereto. In another preferred embodiment, the margins of holes 11 and the margins of the holes 24 may not be joined together but not be sealed, and the chamber space is only sealed by the ring structures 30.

Figure 8:
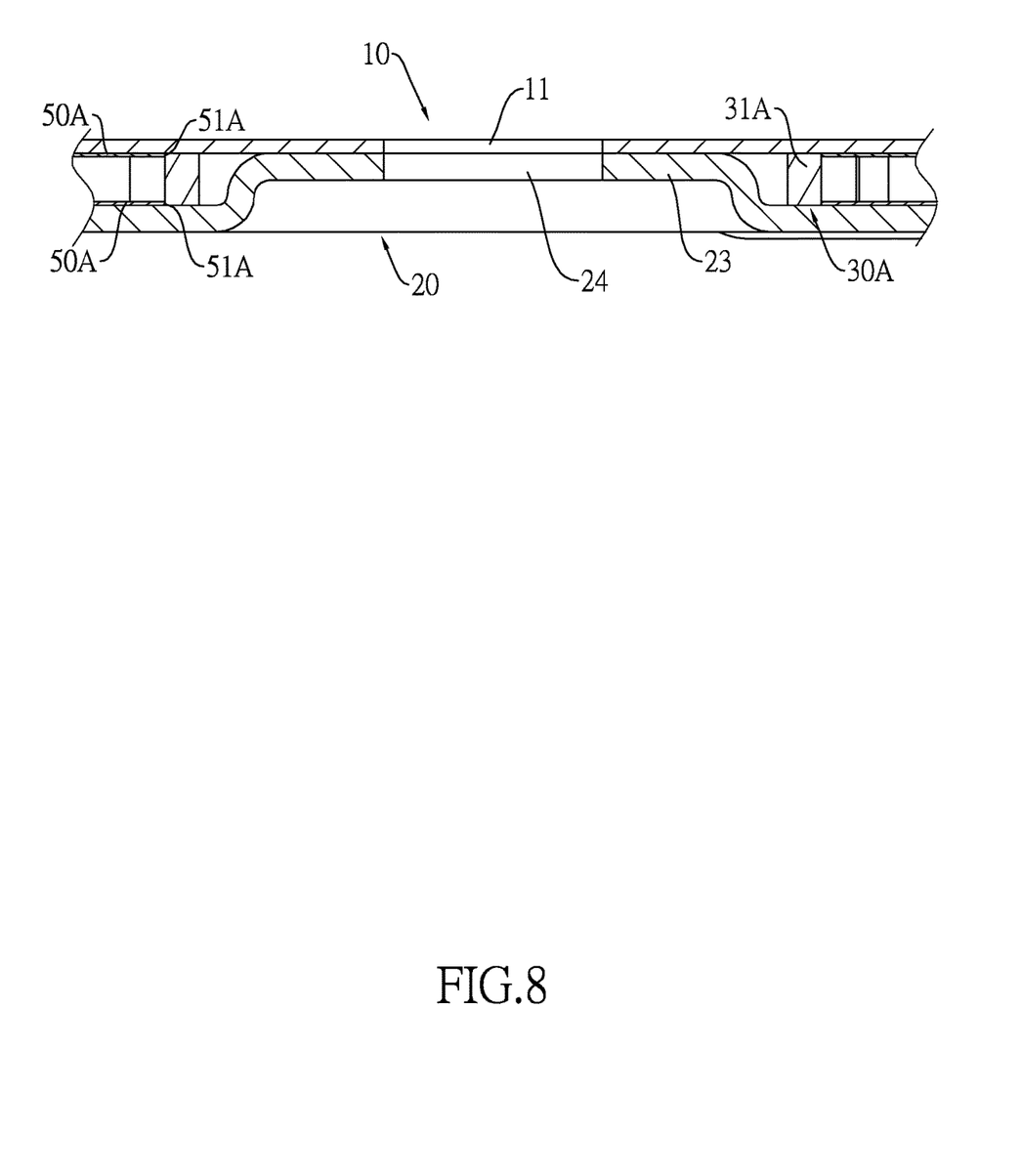
FIG. 8 is a sectional view of a ring structure of the vapor chamber in accordance with a second embodiment of the present invention.
Figure 9:
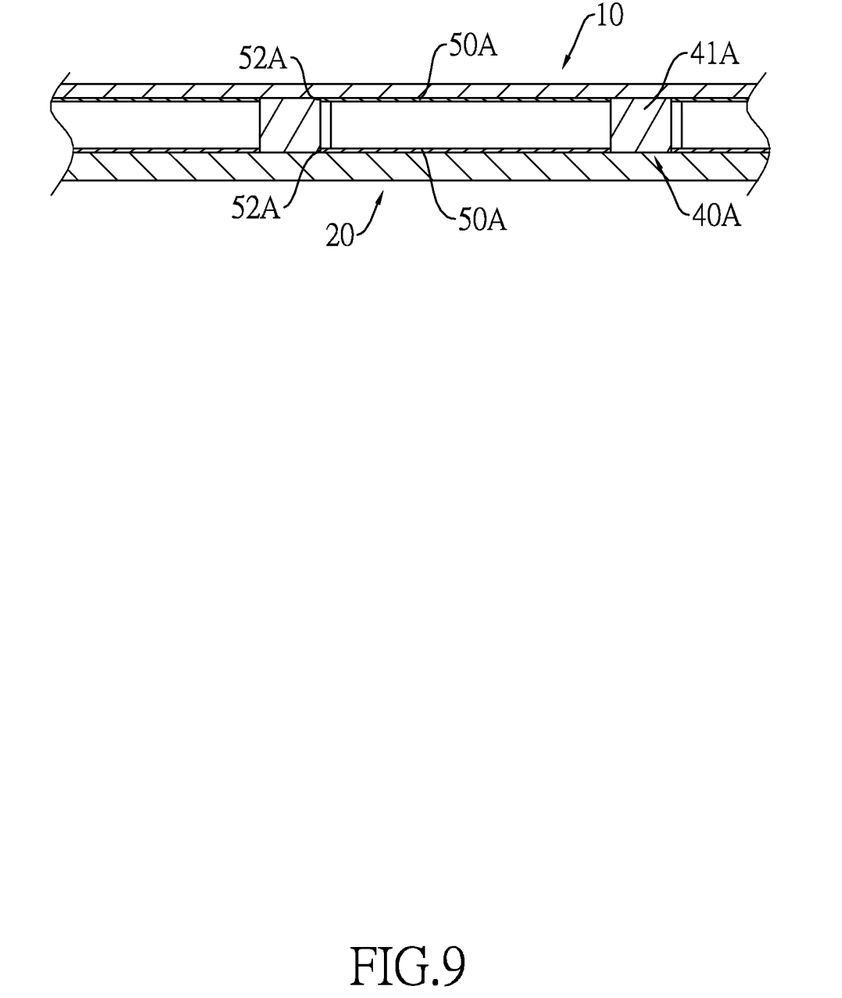
FIG. 9 is a sectional view of a spacer of the vapor chamber in FIG. 8.

Then please refer to FIGS. 8 and 9. A vapor chamber in accordance with a second embodiment of the present invention is provided. One of the differences is that, in the second embodiment, the ring body 31A of each ring structure 30A may not be covered by the second capillary structure layer 32 connecting the first plate 10 and the second plate 20 as the first embodiment, and further the edges of the first apertures 51 of the first capillary structure layer 50A may contact the outer surfaces of the ring bodies 31A. Alternatively, the spacer body 41 of each spacer 40 may not be covered by the second capillary structure layer 42 connecting the first plate 10 and the second plate 20 as the first embodiment, and further the edges of the second apertures 52A of the first capillary structure layer 50A may contact the outer surfaces of the spacer bodies 41A. In another embodiment, both the ring bodies 31A and the spacer bodies 41A are not covered by the capillary structure layers. Another difference is that the vapor chamber may have two first capillary structure layers 50A, but it is not limited thereto; in other words, the vapor chamber may still have only one first capillary structure layer 50A.

Figure 10:
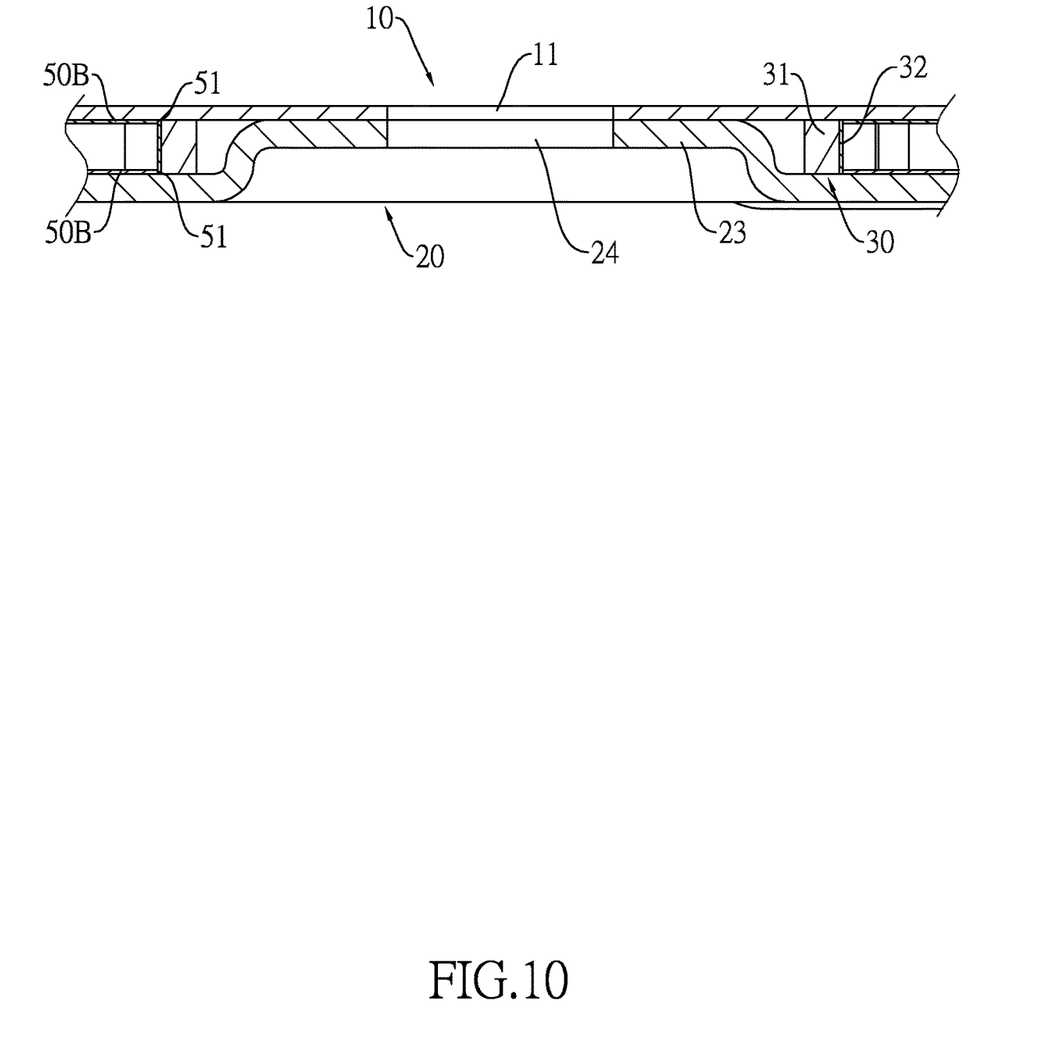
FIG. 10 is a sectional view of a ring structure of the vapor chamber in accordance with a third embodiment of the present invention.

Then please refer to FIG. 10. A vapor chamber in accordance with a third embodiment of the present invention is provided. One of the differences is that, the vapor chamber may have two first capillary structure layers 50B. One of the first capillary structure layers 50B may be attached to the surface of the first plate 10 facing toward the second plate 20, and the other first capillary structure layer 50B may be attached to the bottom surface of the cavity portion 21 of the second plate 20 and may be further on a side wall of the cavity portion 21.

Consequently, the vapor chamber in accordance with the present invention is sealed by the ring structures 30. With such structures, the chamber can keep sealed even when heads of screws mounted through the holes 11, 24 for fixing the vapor chamber are larger and oppress the margins of the holes 11, 24 or even when the vapor chamber undergoes the stamping or drilling process. Besides, with the spacers 40 scattered around inside the chamber, a mechanical strength of the vapor chamber is enhanced, and thus the first plate 10 and the second plate 20 can be thinner. Besides, with the capillary structure layers 32, 42, the working liquid may flow between the first plate 10 and the second plate 20 easier and thereby the efficiency of heat transmission is improved.

Even though numerous characteristics and advantages of the present invention have been set forth in the foregoing description, together with details of the structure and features of many preferred embodiments, the disclosure here is illustrative only, and the scope of the invention is not limited to only the disclosed preferred embodiments. Changes may be made in the details, such as shapes, sizes, arrangements of parts, etc. within the principles of the invention to the full extent.

What is claimed is:

1. A vapor chamber comprising:
a first plate forming at least one hole;
a second plate forming:
a cavity portion concaved away from the first plate;
a margin portion surrounding the cavity portion, and joined to and sealed on the first plate;
at least one annular protrusion being in the cavity portion and protruding toward the first plate, and a top portion of the at least one annular protrusion joined to the first plate; and
at least one hole being in the cavity portion, formed through the at least one annular protrusion, and aligned to and communicating with the at least one hole of the first plate; an edge of the at least one hole of the first plate contacting an edge of the at least one hole of the second plate;
at least one ring structure sealed on and joined to the first plate and the second plate in the cavity portion, and encircling and surrounding the at least one annular protrusion of the second plate and the at least one hole on the at least one annular protrusion;
a chamber formed by the first plate, the cavity portion of the second plate, an inner surface of the margin portion, and an outer surface of the at least one ring structure;
at least one first capillary structure layer in the chamber, and the at least one first capillary structure layer being on a surface, which faces to the second plate, of the first plate, or the at least one first capillary structure layer being on a surface, which faces to the first plate, of the second plate; and
a working liquid in the chamber.

2. The vapor chamber as claimed in claim 1 comprising two first capillary structure layers, one of the first capillary structure layers on the surface, which faces to the second plate, of the first plate, and the other first capillary structure layer on the surface, which faces to the first plate, of the second plate.

3. The vapor chamber as claimed in claim 1, wherein:
each one of the at least one ring structure comprises:
a ring body comprising:
a top connecting surface joined to the first plate;
a bottom connecting surface joined to the second plate;
an outer surface being between the top connecting surface and the bottom connecting surface of the ring body; and
a second capillary structure layer on the outer surface of the ring body; and
each one of the at least one first capillary structure layer comprises:
at least one first aperture surrounding the at least one ring structure and contacting the second capillary structure layer of the at least one ring structure.

4. The vapor chamber as claimed in claim 3, wherein the second capillary structure layer of each one of the at least one ring structure connects with the first plate and the second plate.

5. The vapor chamber as claimed in claim 3, wherein an inner surface of the at least one first aperture contacts the outer surface of the ring body.

6. The vapor chamber as claimed in claim 1 further comprising:
a plurality of spacers joined to the first plate and the second plate, and scattered in the cavity portion of the second plate.

7. The vapor chamber as claimed in claim 4 further comprising:
a plurality of spacers joined to the first plate and the second plate, and scattered in the cavity portion of the second plate.

8. The vapor chamber as claimed in claim 6, wherein:
each one of the spacers comprises:
a spacer body comprising:
a top surface abutting the first plate;
a bottom surface abutting the second plate; and
at least one lateral surface being between the top surface and the bottom surface of the spacer body; and
at least one third capillary structure layer on the at least one lateral surface of the spacer body; and
each one of the at least one first capillary structure layer comprises:
a plurality of second apertures respectively surrounding the spacers and contacting the third capillary structure layers of the spacers respectively.

9. The vapor chamber as claimed in claim 7, wherein:
each one of the spacers comprises:
a spacer body comprising:
a top surface abutting the first plate;
a bottom surface abutting the second plate; and
at least one lateral surface being between the top surface and the bottom surface of the spacer body; and
at least one third capillary structure layer on the at least one lateral surface of the spacer body; and
each one of the at least one first capillary structure layer comprises:
a plurality of second apertures respectively surrounding the spacers and contacting the third capillary structure layers of the spacers respectively.

10. The vapor chamber as claimed in claim 8, wherein the at least one third capillary structure layer of each one of the spacers connects the first plate and the second plate.

11. The vapor chamber as claimed in claim 9, wherein the at least one third capillary structure layer of each one of the spacers connects the first plate and the second plate.

12. The vapor chamber as claimed in claim 8, wherein an inner surface of each one of the second apertures contacts the at least one lateral surface of the spacer body.

13. The vapor chamber as claimed in claim 9, wherein an inner surface of each one of the second apertures contacts the at least one lateral surface of the spacer body.

* * * * *